United States Patent
Pan et al.

(10) Patent No.: US 9,661,766 B2
(45) Date of Patent: May 23, 2017

(54) ELECTRONIC DEVICE PACKAGE BOX

(71) Applicant: BOTHHAND ENTERPRISE INC., Tainan (TW)

(72) Inventors: Yung-Ming Pan, Taoyuan (TW); Chung-Cheng Fan, Taoyuan (TW)

(73) Assignee: BOTHHAND ENTERPRISE INC., Tainan (TW)

( * ) Notice: Subject to any disclaimer, the term of this patent is extended or adjusted under 35 U.S.C. 154(b) by 0 days.

(21) Appl. No.: 15/213,490

(22) Filed: Jul. 19, 2016

(65) Prior Publication Data

US 2017/0034933 A1    Feb. 2, 2017

(30) Foreign Application Priority Data

Jul. 30, 2015    (TW) .............................. 104124648 A

(51) Int. Cl.
*H05K 5/00* (2006.01)

(52) U.S. Cl.
CPC ......... *H05K 5/0091* (2013.01); *H05K 5/0026* (2013.01)

(58) Field of Classification Search
CPC ........................ H05K 5/0091; H05K 5/0026
See application file for complete search history.

(56) References Cited

U.S. PATENT DOCUMENTS

| | | | | |
|---|---|---|---|---|
| 5,656,985 A * | 8/1997 | Lu | .................. | H01F 27/027 174/561 |
| 6,297,721 B1 * | 10/2001 | Lu | .................. | H01F 27/027 336/192 |
| 2002/0093412 A1 * | 7/2002 | Morrison | .............. | H01F 27/292 336/192 |
| 2006/0291145 A1 * | 12/2006 | Takeda | .................. | H01F 27/027 361/600 |
| 2008/0232078 A1 * | 9/2008 | Zhang | .................. | H05K 5/0091 361/809 |
| 2010/0142173 A1 * | 6/2010 | Chen | ..................... | H01F 17/062 361/811 |
| 2011/0095847 A1 * | 4/2011 | Chen | ..................... | H01F 17/062 333/175 |
| 2015/0181728 A1 * | 6/2015 | Tanaka | ................. | H05K 5/0095 361/820 |
| 2015/0195935 A1 * | 7/2015 | Shibayama | .......... | H05K 5/0247 361/807 |
| 2015/0327385 A1 * | 11/2015 | Fan | ....................... | H05K 5/0247 211/26 |
| 2016/0183400 A1 * | 6/2016 | Pan | ......................... | H01F 27/04 361/752 |

* cited by examiner

*Primary Examiner* — Hoa C Nguyen
(74) *Attorney, Agent, or Firm* — Kirton McConkie; Evan R. Witt

(57) ABSTRACT

An electronic device package box is mounted with multiple coil components, is mounted on a circuit board, and includes a box unit, and multiple outer and inner connecting pins. The box unit includes inner and outer surrounding walls, a surrounding base wall connected between the inner and outer surrounding walls, and a surrounding space for receiving the coil components therein. The outer connecting pins are mounted to the outer surrounding wall, and each is connected to a corresponding one of the coil components and the circuit board. The inner connecting pins are mounted to the inner surrounding wall, and each is connected to a corresponding one of the coil components and the circuit board.

8 Claims, 8 Drawing Sheets

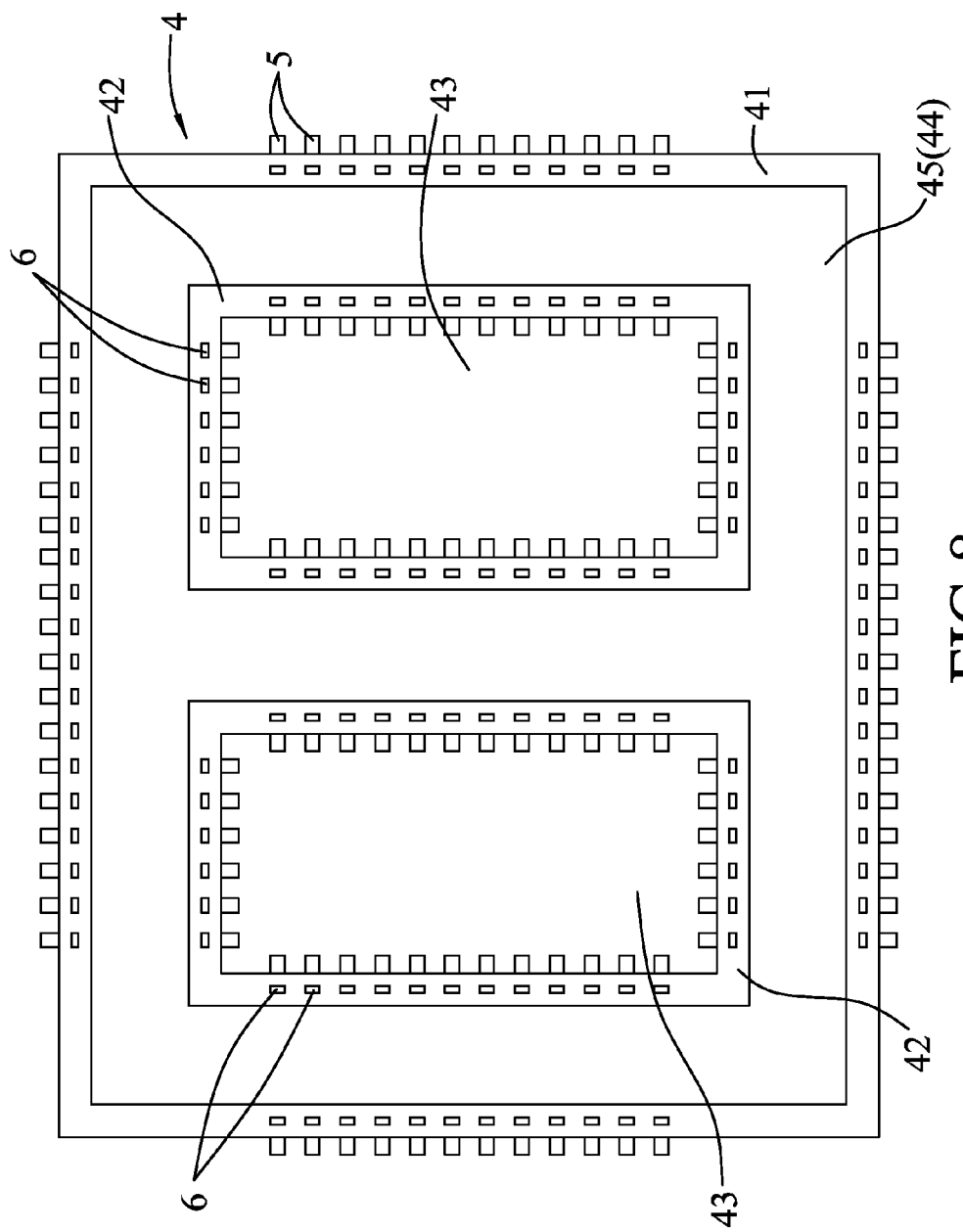

ELECTRONIC DEVICE PACKAGE BOX

CROSS-REFERENCE TO RELATED APPLICATION

This application claims priority of Taiwanese Patent Application No. 104124648, filed on Jul. 30, 2015.

FIELD

The disclosure relates to an electronic device package box, and more particular to an electronic device package box that is adapted to be mounted with a plurality of coil components and that is adapted to be mounted on a circuit board.

BACKGROUND

A conventional electronic device package box is used for receiving electronic components, such as coils, and can be mounted to a circuit board. Generally, there are two common technologies for mounting the conventional electronic device package box to the circuit board, which are through-hole technology and surface-mount technology. When the conventional electronic device package box is mounted to the circuit board by the through-hole technology, the conventional electronic device package box is often named as a dual-in-line package (DIP) device, which includes a plurality of connecting pins that extend through the circuit board. When the conventional electronic device package box is mounted to the circuit board by the surface-mount technology, the conventional electronic device package box is often named as a surface-mount device (SMD). Since different types of package boxes are mounted to the circuit board in different manners, different kinds of the package boxes have distinct structures.

FIG. 1 shows a conventional through-hole package box 1, which is mounted with and electrically connected to a plurality of coils 10, and is mounted to a horizontal circuit board 11 that is formed with a plurality of through holes 111. The conventional through-hole package box 1 includes a base 12, and a plurality of vertical connecting pins 13 that are mounted to the base 12. Each of the connecting pins 13 has an inserting section 131 that extends through a corresponding one of the through holes 111 of the circuit board 11, and a connecting section 132 that is mounted to the base 12 and that is electrically connected to a corresponding one of the coils 10.

Since the connecting pins 13 are directly mounted to the base 12, the number of the connecting pins 13 mounted can be relatively large. However, the through holes 111 formed in the circuit board 11 must be spaced apart from each other. As a result, the total area of the circuit board 11 is increased, which is undesirable under the current trend of miniaturization design.

Referring to FIGS. 2 and 3, a conventional surface-mount package box 2 is mounted with and electrically connected to a plurality of coils 20, and is mounted to a circuit board 21. The conventional surface-mount package box 2 includes a base 22, and a plurality of connecting pins 23 that are mounted to the base 22. Each of the connecting pins 23 is electrically connected to a corresponding one of the coils 20. The base 22 has a rectangular base wall 221, and a surrounding wall 222 that extends from the base wall 221 and toward the circuit board 21. The connecting pins 23 are mounted to the surrounding wall 222 and are spaced apart from each other. Each of the connecting pins 23 has a protruding portion 231 that can be horizontally mounted to the circuit board 21.

The use of surface-mount technology avoids the need for drilling holes in the circuit board 21. Nonetheless, in the surface-mount technology, the connecting pins 23 must protrude from the surrounding wall 222. The surrounding wall 222 needs to be made larger to accommodate more connecting pins 23.

SUMMARY

Therefore, an object of the present disclosure is to provide an electronic device package box that can alleviate at least one of the drawbacks associated with the prior art.

According to the present disclosure, the electronic device package box is adapted to be mounted with a plurality of coil components and is adapted to be mounted on a circuit board.

The electronic device package box includes a box unit, a plurality of outer connecting pins and a plurality of inner connecting pins. The box unit includes at least one inner surrounding wall, an outer surrounding wall that surrounds the inner surrounding wall, a surrounding base wall that is connected between the outer surrounding wall and the inner surrounding wall, and a surrounding space that is defined by the outer surrounding wall, the inner surrounding wall and the surrounding base wall, and that is adapted to receive the coil components therein. The outer connecting pins are mounted to the outer surrounding wall and are spaced apart from each other. Each of the outer connecting pins is adapted to be electrically connected to a corresponding one of the coil components and is electrically connected to the circuit board. The inner connecting pins are mounted to the inner surrounding wall and are spaced apart from each other. Each of the inner connecting pins is adapted to be electrically connected to a corresponding one of the coil components and is electrically connected to the circuit board.

BRIEF DESCRIPTION OF THE DRAWINGS

Other features and advantages of the present disclosure will become apparent in the following detailed description of the embodiments with reference to the accompanying drawing, of which:

FIG. 8 is a top view of a third embodiment of the electronic device package box according to the present disclosure.

DETAILED DESCRIPTION

Figure 1:
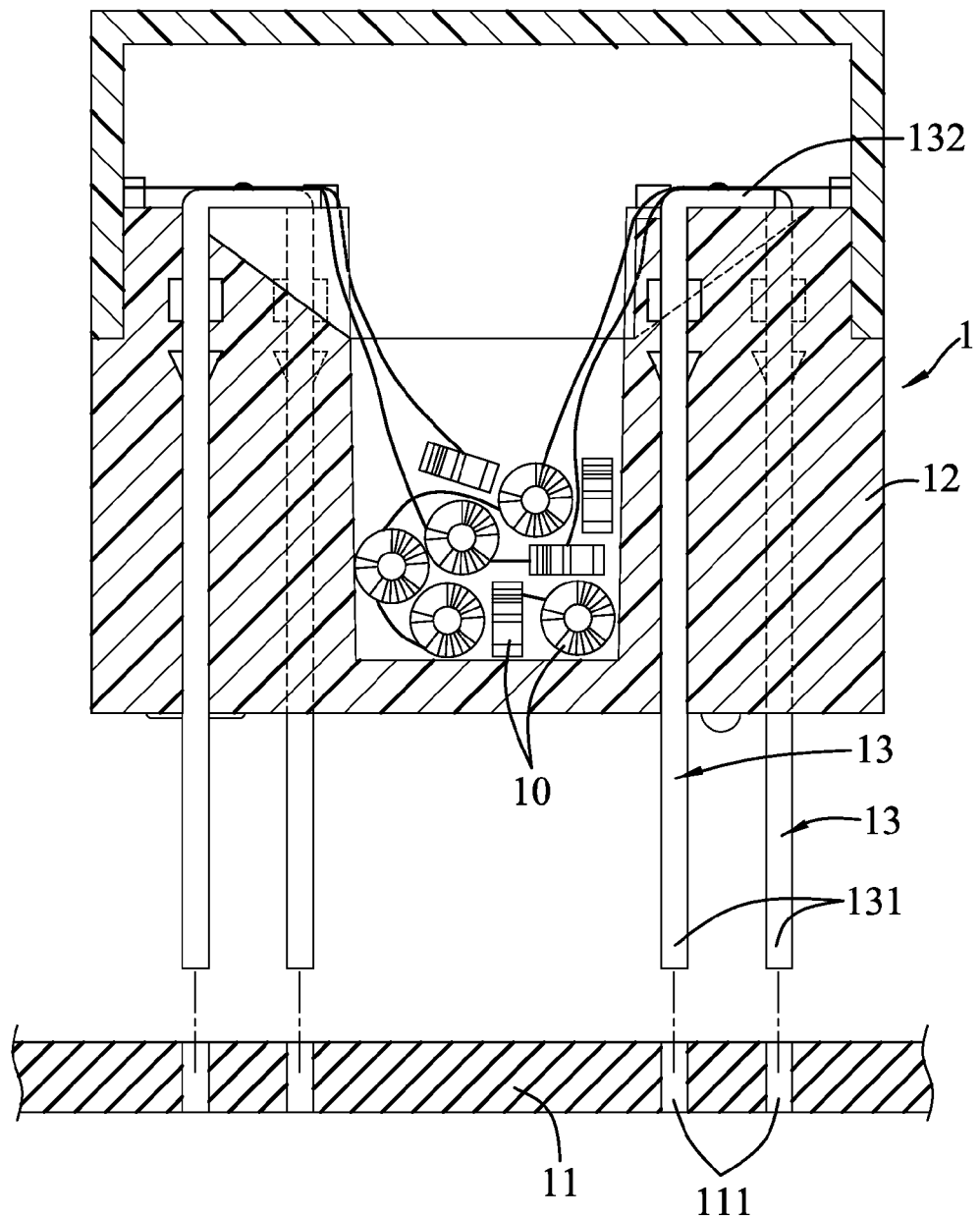
FIG. 1 is a partly sectional view of a conventional through-hole package box that is to be mounted to a circuit board.
Figure 2:
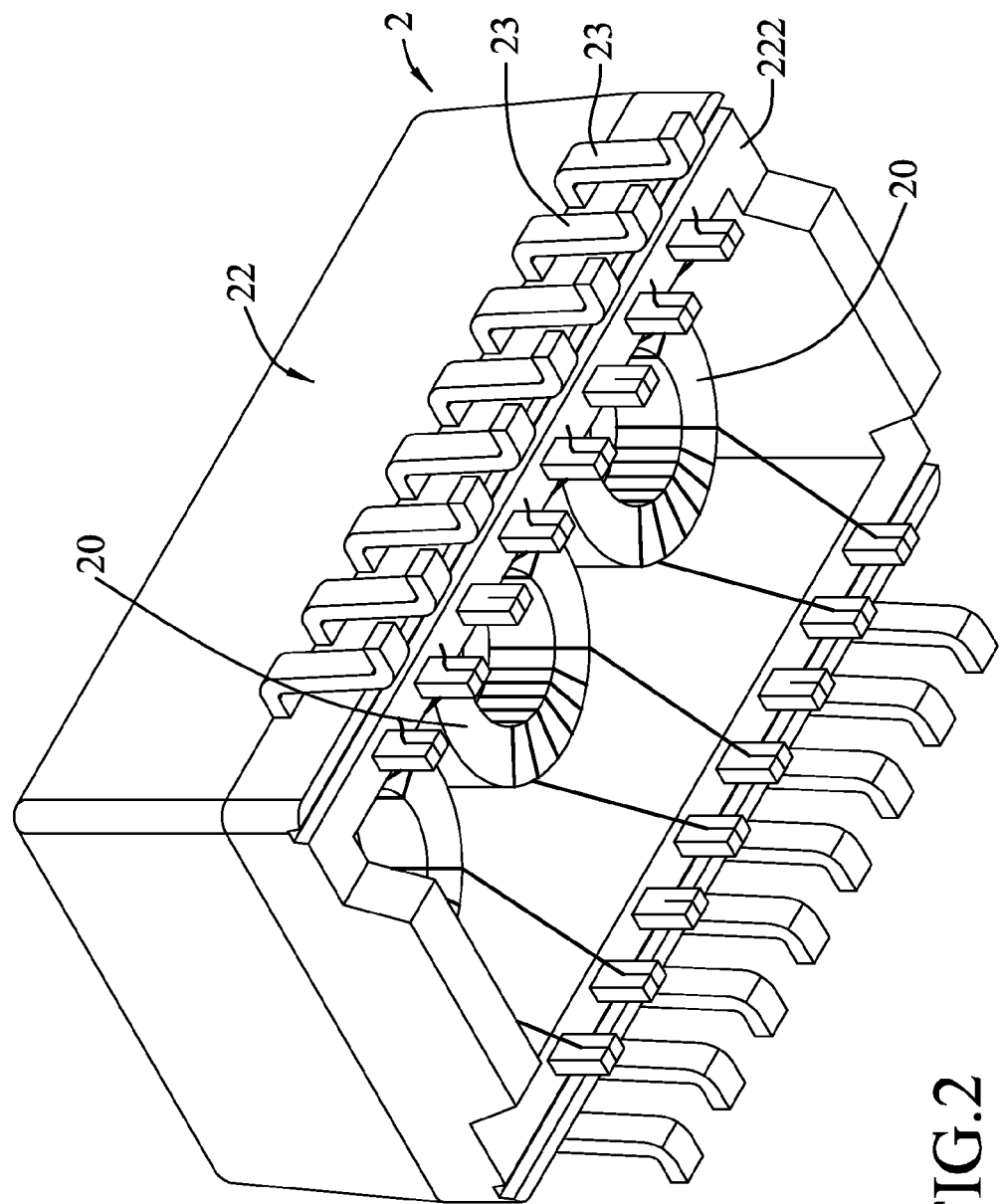
FIG. 2 is a perspective view of a conventional surface-mount package box.
Figure 3:
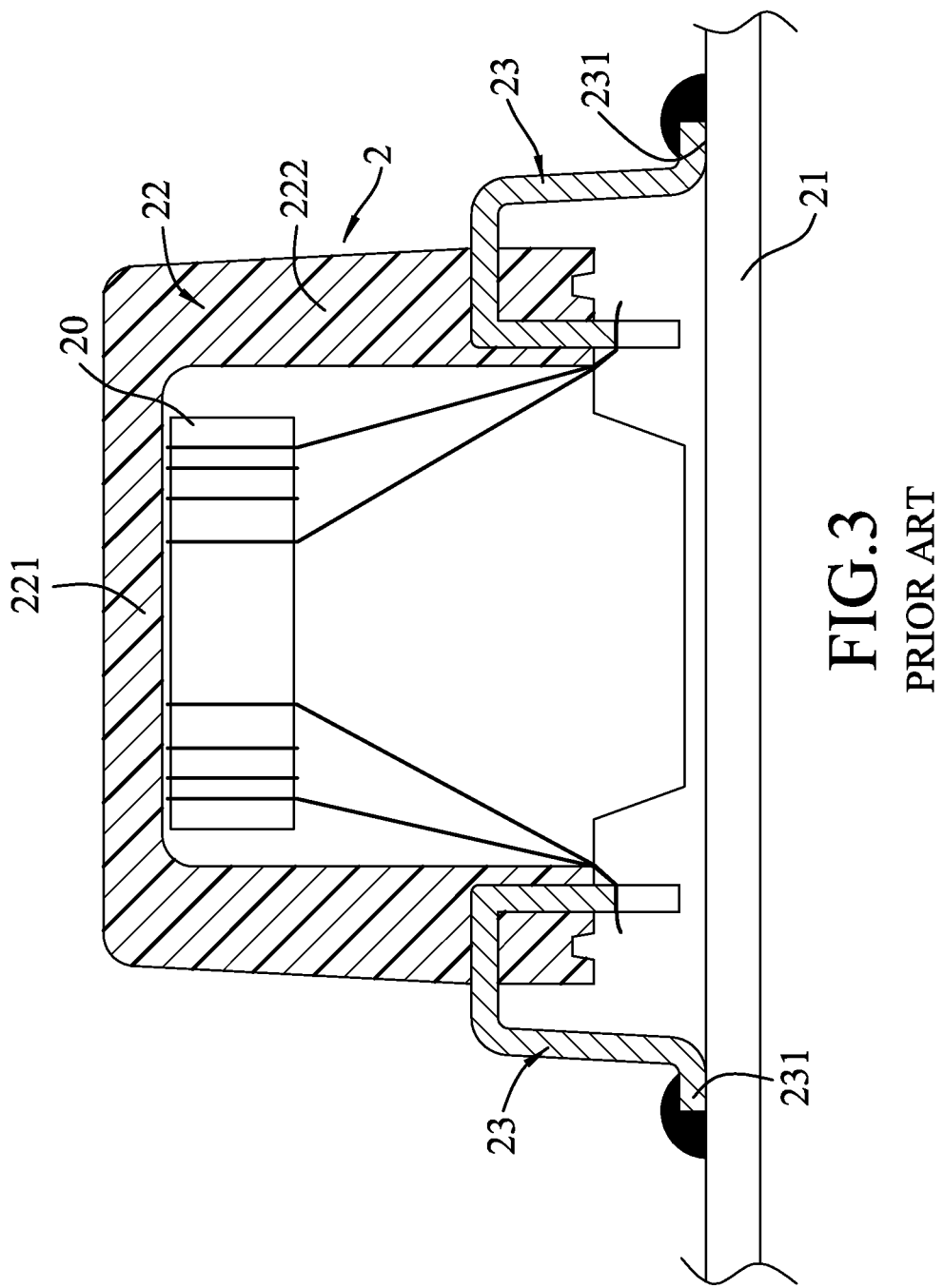
FIG. 3 is a partly sectional view of the conventional surface-mount package box that is mounted to another circuit board.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 4:
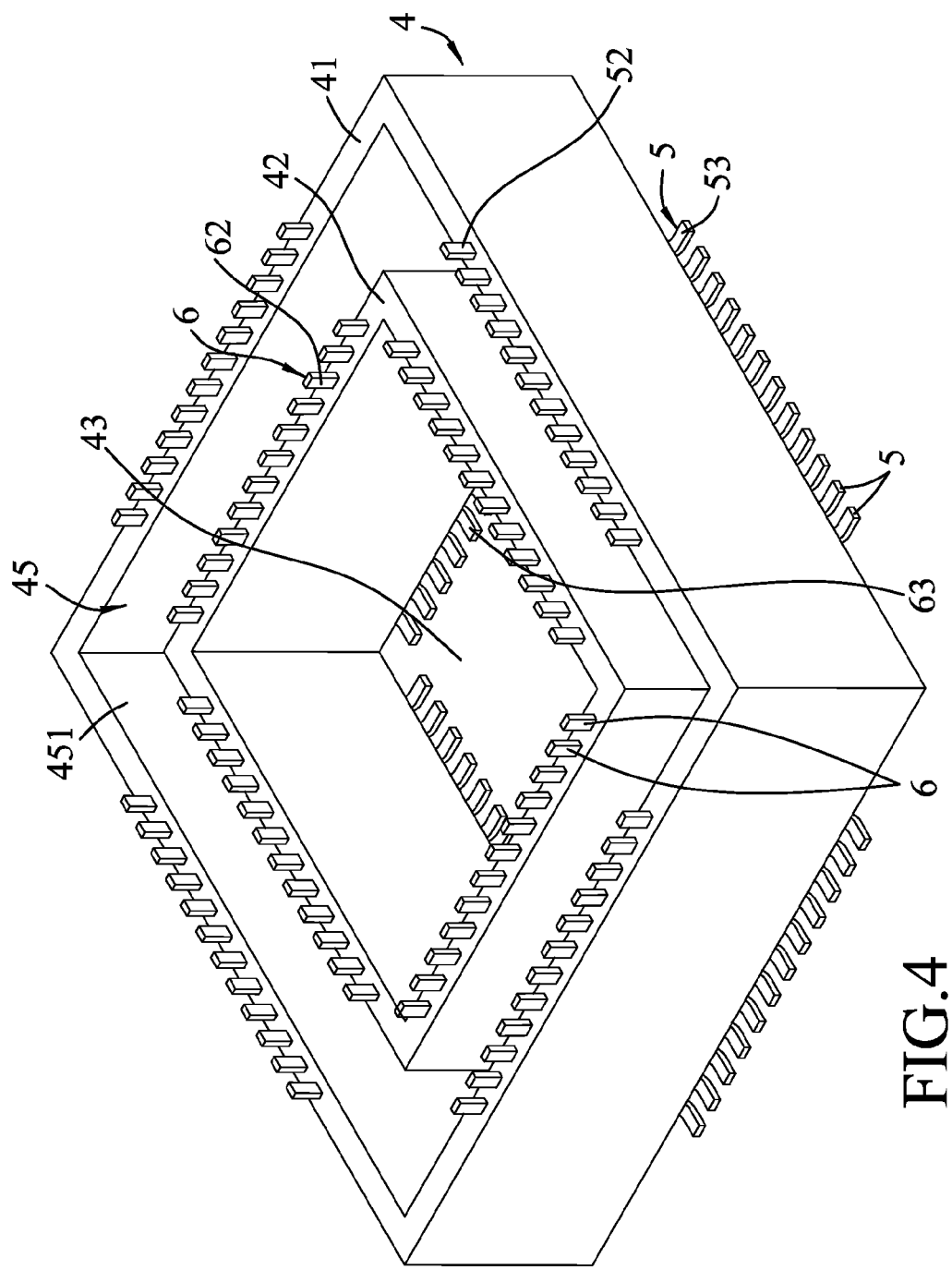
FIG. 4 is a perspective view of a first embodiment of an electronic device package box according to the present disclosure.
Figure 5:
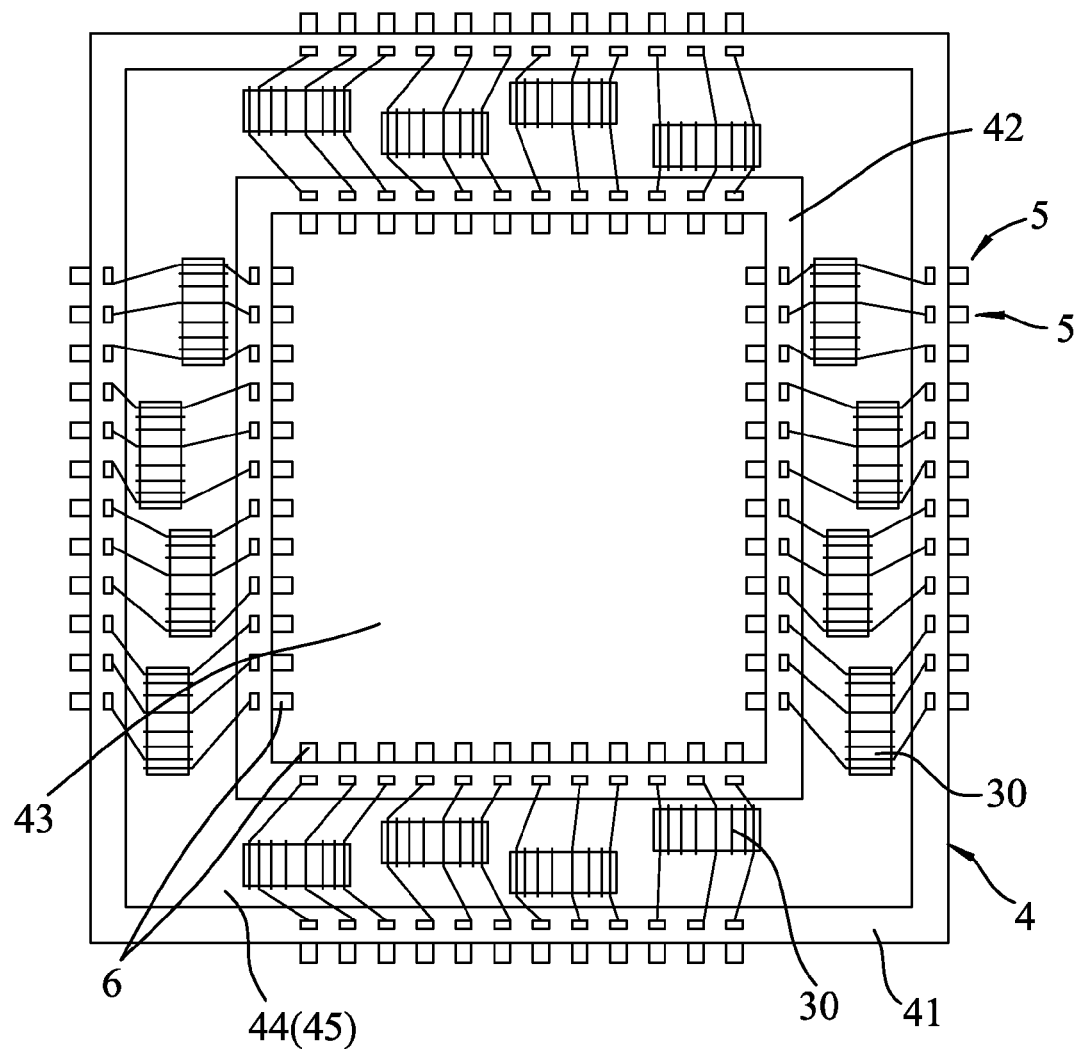
FIG. 5 is a top view of the first embodiment.
Figure 6:
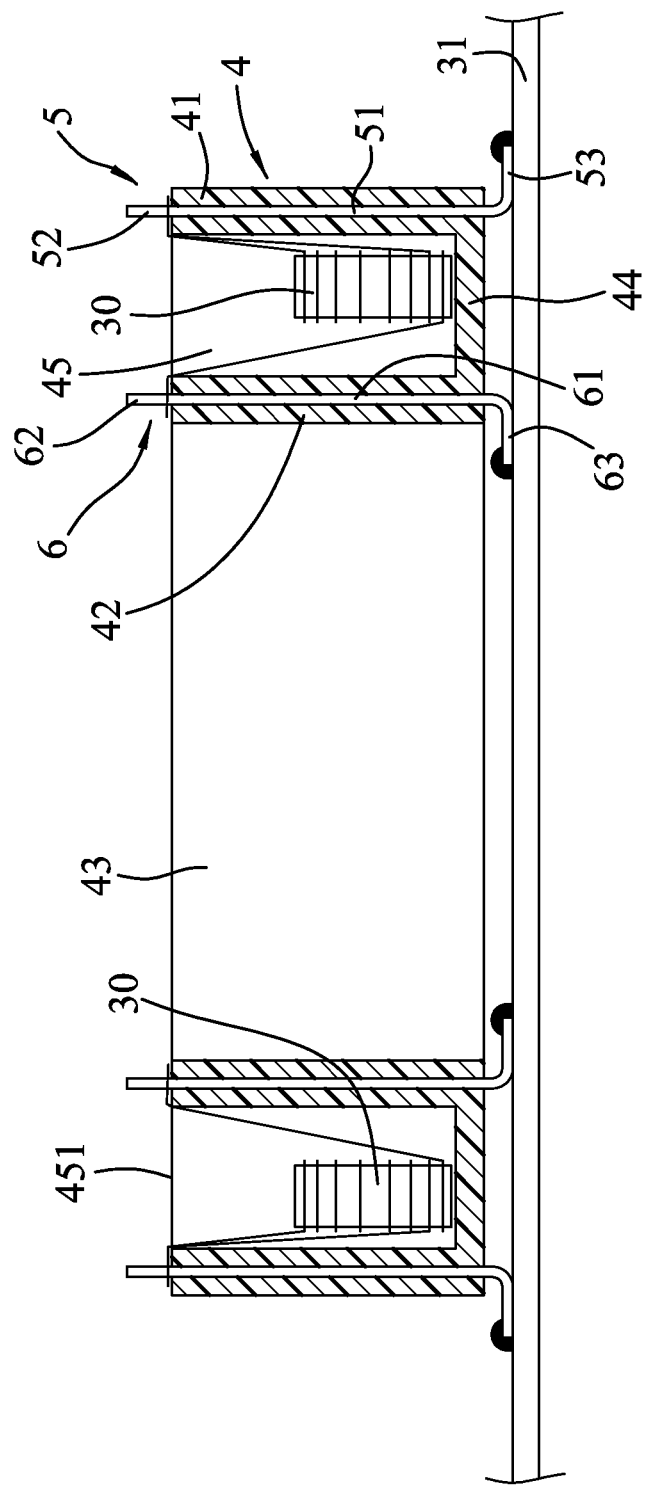
FIG. 6 is a partly sectional view of the first embodiment.

Referring to FIGS. 4 to 6, a first embodiment of an electronic device package box according to the present disclosure is adapted to be mounted with a plurality of coil components 30 and is adapted to be mounted on a circuit board 31. The electronic device package box includes a box unit 4, a plurality of outer connecting pins 5 and a plurality of inner connecting pins 6. The box unit 4 includes at least one inner surrounding wall 42 that defines a through hole 43, an outer surrounding wall 41 surrounding the inner surrounding wall 42, a surrounding base wall 44 that is connected between the outer surrounding wall 41 and the inner surrounding wall 42, and a surrounding space 45 that is defined by the outer surrounding wall 41, the inner surrounding wall 42 and the surrounding base wall 44, and that is adapted to receive the coil components 30 therein. The outer surrounding wall 41 and the inner surrounding wall 42 are perpendicular to the circuit board 31. The surrounding base wall 44 is located proximate to the circuit board 31. The surrounding space 45 is formed with an opening 451 that faces away from the circuit board 31. In this embodiment, the base 4 is rectangular in shape. However, in practical use, the base 4 may be in other shapes, such as circle, rhombus, etc.

The outer connecting pins 5 are mounted to the outer surrounding wall 41 and are spaced apart from each other. Each of the outer connecting pins 5 is adapted to be electrically connected to a corresponding one of the coil components 30 and is electrically connected to the circuit board 31. In this embodiment, each of the outer connecting pins 5 has an outer embedded portion 51 that is embedded in the outer surrounding wall 41, an outer mounting portion 53 that is integrally connected to the outer embedded portion 51, that extends parallel to the circuit board 31, and that is adapted to be electrically connected to the circuit board 31 (e.g., by a welding technique), and an outer wire-connecting portion 52 that is integrally connected to the outer embedded portion 51, that extends from a top end of the outer surrounding wall 41, and that is adapted to be electrically connected to a corresponding one of the coil components 30. To be more specific, the outer wire-connecting portion 52 and the outer mounting portion 53 of each of the outer connecting pins 5 are respectively connected to opposite ends of the outer embedded portion 51, and respectively extend from opposite ends of the outer surrounding wall 41.

The inner connecting pins 6 are mounted to the inner surrounding wall 42 and are spaced apart from each other. Each of the inner connecting pins 6 is adapted to be electrically connected to a corresponding one of the coil components 30 and is electrically connected to the circuit board 31. In this embodiment, each of the inner connecting pins 6 has an inner mounting portion 63 that extends inwardly in a direction parallel to the circuit board 31, and that is adapted to be electrically connected to the circuit board 31 (e.g., by a welding technique), an inner embedded portion 61 that is integrally connected to the inner mounting portion 63 and that is mounted in the inner surrounding wall 42, and an inner wire-connecting portion 62 that extends from a top end of the inner surrounding wall 42, that is integrally connected to the inner embedded portion 61 and that is adapted to be electrically connected to a corresponding one of the coil components 30. To be more specific, the inner wire-connecting portion 62 and the inner mounting portion 63 of each of the inner connecting pins 6 are respectively connected to opposite ends of the inner embedded portion 61, and respectively extend from opposite ends of the inner surrounding wall 42.

It is worth mentioning that the outer mounting portion 53 of each of the outer connecting pins 5 extends outwardly from the outer surrounding wall 41, and the inner mounting portion 63 of each of the inner connecting pins 6 extends inwardly from the inner surrounding wall 42. With the inner surrounding wall 42 surrounded by the outer surrounding wall 41, the electronic device package box is capable of accommodating more connecting pins 5, 6. Moreover, since the outer mounting portion 53 of each of the outer connecting pins 5 extends outwardly from the outer surrounding wall 41, and the inner mounting portion 63 of each of the inner connecting pins 6 is exposed from the through hole 43, a user can examine the condition of wire connection to the outer mounting portion 53 of each of the outer connecting pins 5 and the inner mounting portion 63 of each of the inner connecting pins 6 by simply viewing from top of the electronic device package box without being blocked by the surrounding base wall 44.

Figure 7:
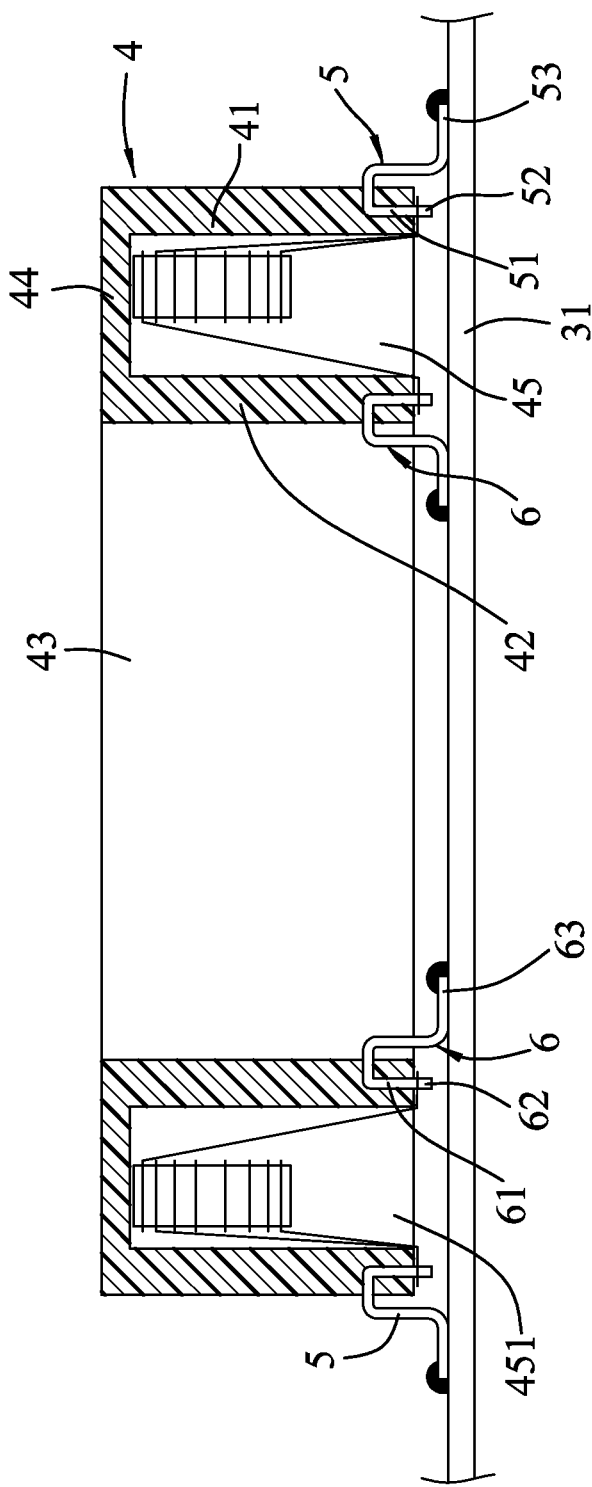
FIG. 7 is a partly sectional view of a second embodiment of the electronic device package box according to the present disclosure.

Referring to FIG. 7, a second embodiment of the electronic device package box according to the present disclosure has a structure similar to that of the first embodiment, with the differences described below.

In the second embodiment, the opening 451 of the surrounding space 45 is located proximate to the circuit board 31. The surrounding base wall 44 of the box unit 4 is located away from the circuit board 31. The outer embedded portion 51 of each of the outer connecting pins 5 is L-shaped. The inner embedded portion 61 of each of the inner connecting pins 6 is also L-shaped. The outer wire-connecting port ion 52 of each of the outer connecting pins 5 is located proximate to the circuit board 31. The inner wire-connecting portion 62 of each of the inner connecting pins 6 is also located proximate to the circuit board 31. The configurations of the base 4, the outer connecting pins 5 and the inner connecting pins 6 may be changed according to practical requirements, while still achieving the purpose of increased connecting pin number and facilitated inspection.

Referring to FIG. 8, a third embodiment of the electronic device package box according to the present disclosure has a structure similar to that of the first embodiment, with the differences described below.

In the third embodiment, the box unit 4 includes two inner surrounding walls 42 that are surrounded by the outer surrounding wall 41. Each of the inner surrounding walls 42 defines a through hole 43. Each of the inner connecting pins 6 is mounted to a corresponding one of the inner surrounding walls 42. In each of the inner connecting pins 6, the inner mounting portion 63 extends inwardly in a direction parallel to the circuit board 31 and is adapted to be electrically connected to the circuit board 31, the inner embedded portion 61 is integrally connected to the inner mounting portion 63 and is mounted in the corresponding one of the inner surrounding walls 42, and the inner wire-connecting portion 62 is integrally connected to the inner embedded portion 61 and is adapted to be electrically connected to a corresponding one of the coil components 30. It is worth mentioning that, the number of the inner surrounding walls 42 is not limited to two, and may be changed according to practical requirements.

In the description above, for the purposes of explanation, numerous specific details have been set forth in order to provide a thorough understanding of the embodiment (s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment (s) but is intended to cover various arrangements included within the spirit and scope of the broadest interpretation so as to encompass all such modifications and equivalent arrangements.

What is claimed is:

1. An electronic device package box adapted to be mounted with a plurality of coil components and adapted to be mounted on a circuit board, said electronic device package box comprising:

a box unit that includes at least one inner surrounding wall, an outer surrounding wall surrounding said inner surrounding wall, a surrounding base wall connected between said outer surrounding wall and said inner surrounding wall, and a surrounding space defined by said outer surrounding wall, said inner surrounding wall and said surrounding base wall, and adapted to receive the coil components therein;

a plurality of outer connecting pins that are mounted to said outer surrounding wall and that are spaced apart from each other, each of said outer connecting pins being adapted to be electrically connected to a corresponding one of the coil components and being electrically connected to the circuit board; and a plurality of inner connecting pins that are mounted to said inner surrounding wall and that are spaced apart from each other, each of said inner connecting pins being adapted to be electrically connected to a corresponding one of the coil components and being electrically connected to the circuit board.

2. The electronic device package box as claimed in claim 1, wherein said inner surrounding wall defines a through hole, each of said inner connecting pins having an inner mounting portion that extends inwardly in a direction parallel to the circuit board, and that is adapted to be electrically connected to the circuit board.

3. The electronic device package box as claimed in claim 2, wherein each of said inner connecting pins further has an inner embedded portion that is integrally connected to said inner mounting portion and that is mounted in said inner surrounding wall, and an inner wire-connecting portion that is integrally connected to said inner embedded portion and that is adapted to be electrically connected to a corresponding one of the coil components.

4. The electronic device package box as claimed in claim 3, wherein each of said outer connecting pins has an outer embedded portion that is embedded in said outer surrounding wall, an outer mounting portion that is integrally connected to said outer embedded portion, that extends parallel to the circuit board, and that is adapted to be electrically connected to the circuit board, and an outer wire-connecting portion that is integrally connected to said outer embedded portion and that is adapted to be electrically connected to a corresponding one of the coil components.

5. The electronic device package box as claimed in claim 4, wherein said surrounding base wall is located proximate to the circuit board, said surrounding space being formed with an opening that faces away from the circuit board, said inner wire-connecting portion and said inner mounting portion of each of said inner connecting pins extending from opposite ends of said inner surrounding wall, respectively, said outer wire-connecting portion and said outer mounting portion of each of said outer connecting pins extending from opposite ends of said outer surrounding wall, respectively.

6. The electronic device package box as claimed in claim 4, wherein said surrounding space is formed with an opening that is located proximate to the circuit board, said inner wire-connecting portion of each of said inner connecting pin being located proximate to the circuit board, said outer wire-connecting portion of each of said outer connecting pins being located proximate to the circuit board.

7. The electronic device package box as claimed in claim 1, wherein said box unit includes two of said inner surrounding walls, each of which defines a through hole, each of said inner connecting pins being mounted to a corresponding one of said inner surrounding walls, and having an inner mounting portion that extends inwardly in a direction parallel to the circuit board, and that is adapted to be electrically connected to the circuit board.

8. The electronic device package box as claimed in claim 7, wherein each of said inner connecting pins further has an inner embedded portion that is integrally connected to said inner mounting portion of said inner connecting pin and that is mounted in said corresponding one of said inner surrounding walls, and an inner wire-connecting portion that is integrally connected to said inner embedded portion and that is adapted to be electrically connected to a corresponding one of the coil components.

* * * * *